Figure 1:
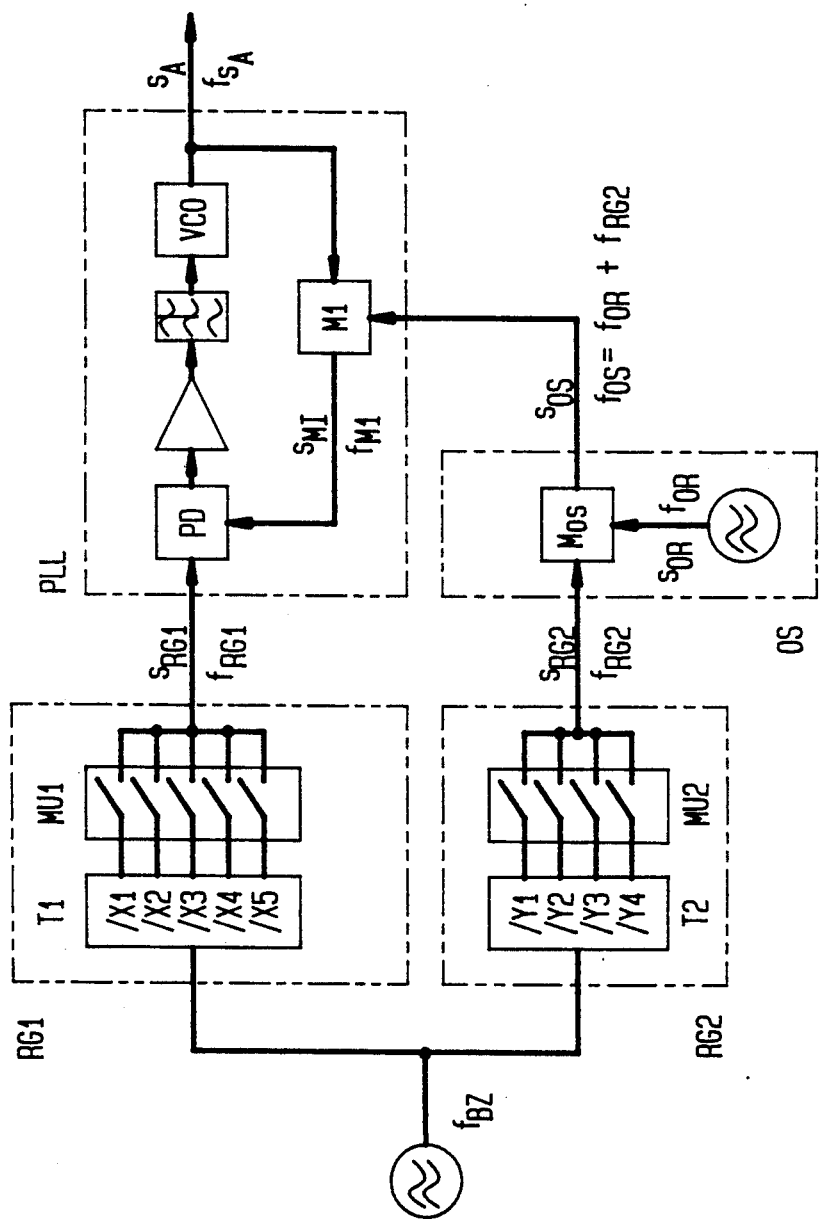

United States Patent [19]

Fognini et al.

[11] Patent Number: 5,019,785

[45] Date of Patent: May 28, 1991

[54] FREQUENCY SYNTHESIZING DEVICE

[75] Inventors: Bruno Fognini, Zurich, Switzerland; Helmut Heinz, Munich, Fed. Rep. of Germany

[73] Assignee: Siemens-Albis Aktiengesellschaft, Zurich, Switzerland

[21] Appl. No.: 423,074

[22] Filed: Oct. 18, 1989

[30] Foreign Application Priority Data

Oct. 18, 1988 [CH] Switzerland .................. 03876/88

[51] Int. Cl.$^5$ .................. H03L 7/00; H03B 19/00
[52] U.S. Cl. .................. 328/14; 328/15; 307/271; 331/1 R
[58] Field of Search .................. 328/14, 16, 15, 140; 307/219.1, 271, 529; 331/2, 40, 41, 1 R

[56] References Cited

U.S. PATENT DOCUMENTS

| | | | |
|---|---|---|---|
| 4,070,634 | 1/1978 | Barker et al. | 331/2 |
| 4,667,168 | 5/1987 | Shiomi et al. | 331/2 |
| 4,839,603 | 6/1989 | Mower et al. | 328/15 |
| 4,847,516 | 7/1989 | Fujita et al. | 331/2 |
| 4,862,106 | 8/1989 | Toda et al. | 331/2 |
| 4,878,027 | 10/1989 | Carp et al. | 331/40 |

FOREIGN PATENT DOCUMENTS

| | | |
|---|---|---|
| 0147897 | 7/1985 | European Pat. Off. . |
| 1177697 | 9/1964 | Fed. Rep. of Germany . |
| 92133 | 8/1968 | France . |
| 2015277 | 9/1979 | United Kingdom . |
| 0238710 | 9/1987 | United Kingdom .................. 328/14 |

OTHER PUBLICATIONS

European Search Report on Application RS 83147 CH.
The Radio and Electronic Engineer, vol. 50, No. 3, Mar. 1980, pp. 122-126, Institution of Electronic and Radio Engineers, London, GB; G. A. Warwick et al.: "The Frequency Shifting Synthesizer".
Patent Abstracts of Japan, vol. 9, No. 185 (E-332) (1908), Jul. 31, 1985 and JP-A-60 55 730 (Nippon Denki K.K.), 01/04/1985.

Primary Examiner—Stanley D. Miller
Assistant Examiner—Toan Tran
Attorney, Agent, or Firm—Adel A. Ahmed

[57] ABSTRACT

A frequency synthesizing device comprises two reference frequency generators RG1 and RG2, an offset stage OS and a phase-locked loop PLL. In the phase-locked loop, which operates as a tracking filter, the output frequency $fs_A$ is generated by the addition of the frequencies $f_{RG1}$ and $f_{OS}$. The output frequency $fs_A$ has a very high spectral purity, since all interfering spurious signals are blocked by the tracking filter. By a proper selection of the reference frequencies $f_{RG1}$, $f_{RG2}$ and $f_{OR}$, it is ensured that all interfering spurious signals lie outside the bandwidth $B_{TF}$ of the tracking filter and are accordingly blocked. As a result, it is not necessary to filter the signals $S_{RG1}$, $S_{RG2}$ and $S_{OS}$.

12 Claims, 1 Drawing Sheet

FREQUENCY SYNTHESIZING DEVICE

The present invention relates generally to a frequency synthesizing device.

Phase-locked Loops (PLLs) are often used in the synthesis of frequencies in frequency synthesizing devices. In the book "Theorie und Anwendungen des Phase-locked Loops (Theory and Applications of the Phase-locked loop)" by Roland Best (Aarau, 1976), the principles of the mode of operation of these circuits is explained. FIG. 79e on page 82 thereof shows a phase-locked loop which is suitable for the generation of high frequencies, with a variable frequency divider and a mixer stage. A variable or fixed offset frequency and a fixed reference frequency are fed to the phase-locked loop. The phase noise of such an arrangement in this case is dependent upon the division ratio of the variable frequency divider and has a minimum value for the division ratio one. An improvement on this circuit, known from the HewlettPackard Journal (Feb. 1981), has the division ratio of the frequency divider always equal to one and feeds two variable frequencies to the phase-locked loop.

If the output signal of the phase-locked loop is to be free of interference by spurious signals, then the input offset and reference frequencies should likewise have no spurious signals. To eliminate interference from spurious signals, both the offset and reference frequencies are fed to a band-pass filter. However, the requisite filter equipment makes this solution a very expensive one.

An object of the present invention is therefore to improve on the known circuit.

In accordance with an aspect of the invention, a frequency synthesizing device for the generation of various frequency channels includes two reference frequency generators, an offset stage, and a phase-locked loop (PLL). The reference frequency generators generate signals ($s_{RG1}$) and ($s_{RG2}$), whose respective frequencies $f_{RG1}$ and $f_{RG2}$ can be selected to be equal to a fraction of a standard frequency $f_{BZ}$. The frequency ($f_{OS}$) of the output signal ($s_{OS}$) of the offset stage (OS) takes on the value of a predetermined frequency $f_{OR}$ of an offset reference signal ($s_{OR}$) or the value of a frequency ($f_{OR} + f_{RG2}$) or ($f_{OR} - f_{RG2}$) of a sum or difference signal formed by combining the signals ($s_{OR}$) and ($s_{RG2}$). At the output of the voltage-controlled oscillator VCO) in the phase-locked loop, there is generated the output signal ($s_A$) of the frequency synthesizing device, whose frequency ($fs_A$) results from the addition of the frequency ($f_{RG1}$) and ($f_{OS}$) of the signals ($s_{RG1}$) and ($s_{OS}$), respectively. The phase-locked loop is designed as a tracking filter. All of the frequencies of the reference frequency generators RG1, RG2 and the offset stage OS can be selected and combined with one another such that the resulting sidebands always lie outside the bandwidth of the tracking filter.

In accordance with another aspect of the invention, all the frequencies $f_{RG1}$ and $f_{RG2}$ emitted by reference frequency generators RG1 and RG2 correspond to a multiple of the lowest frequency $f_{RG1min}$ generated by the reference frequency generator RG1 and that the value of the frequency $f_{RG1min}$ is greater than half the bandwidth of the tracking filter ($f_{RG1min} > \frac{1}{2}$ BTF).

In accordance with yet another aspect of the invention, all the frequencies $f_{RG2max}$ correspond to a multiple of the highest frequency $f_{RG1max}$ generated by the reference frequency generator RG1.

In accordance with still another aspect of the invention, signals $s_A$ and $s_{OS}$ are fed to a mixer stage M1 in the phaselocked loop, at whose output there is formed a signal $s_{M1}$ with the frequency ($fs_A - f_{OS}$), whose phase is compared in the phase detector PD of the phase-locked loop (PLL) with the phase of the signal $s_{RG1}$.

A frequency synthesizing device according to the invention exhibits a reduced amount of circuitry, with a simultaneously increased spectral purity of the output signals, the elimination of the band-pass filters mentioned above, diminished phase noise and the freedom of the frequency spectrum of the output signal from interference by spurious signals.

The invention is explained below in detail, by way of an exemplary embodiment with the aid of a drawing.

The drawing shows a frequency synthesizing arrangement in accordance with the invention.

In the following description, it is sometimes convenient to refer to a "frequency" being "derived", "eliminated" and so forth, as the case may be, from which it will be understood, of course, that this will usually be a reference to a signal component of such frequency.

The frequency synthesizing device shown in the drawing includes a phase-locked loop PLL, comprising a phase detector PD, an amplifier module, a low-pass filter, a mixer stage M1 and a voltage-controlled oscillator VCO, to which there are fed two signals $s_{OS}$ and $s_{RG1}$ with frequencies $f_{OS}$ and $f_{RG1}$, respectively.

The frequency $f_{RG1}$ derived in the first reference frequency generator RG1 by dividing a standard frequency $f_{BZ}$ and takes on any one of five values. The value of frequency $f_{RG1}$ is selected by way of a multiplexer MU1. The frequency division takes place in a divider T1 with division factors X1 ... X5. In addition to the basic frequency $f_{RG1}$, harmonic oscillations may also occur in signal $s_{RG1}$. Signal $s_{RG1}$ is fed without prior filtering to an input of a phase detector PD of the phase-locked loop PLL.

In the same way, the frequency $f_{RG2}$ is generated using division factors Y1 ... Y4 and its value is selected by way of a multiplexer MU2. Signal $s_{RG2}$ which, in addition to the basic frequency $f_{RG2}$, likewise contains harmonic oscillations, is fed to a single sideband mixer stage $M_{OS}$ in an offset stage OS, at whose second input there is a signal $s_{OR}$ with the offset reference frequency $f_{OR}$. At the output of the offset stage OS is the signal $s_{OS}$ with the frequency $f_{OS} = f_{OR} + f_{RG2}$. In this case, the harmonic oscillations contained in the signal $s_{RG2}$ are also superimposed on the offset reference frequency $f_{OR}$. The signal $s_{OS}$ is fed unfiltered to an input of a mixer stage M1 in the phase-locked loop PLL.

The frequency $fs_A = f_{OR} + f_{RG2} + f_{RG1}$ of the output signal $s_A$ of a voltage-controlled oscillator VCO, and thus of the frequency synthesizing device, is formed while the frequency difference $f_{M1} = fs_A - (f_{OR} + f_{RG2})$ generated in the mixer stage M1 is compared in the phase detector PD with the frequency $f_{RG1}$. When the loop is in a steady state, the frequencies $f_{RG1}$ and $f_{M1}$ take on the same value.

The mixing of the unfiltered signals $s_{OS}$ and $s_{RG1}$ in the phase-locked loop generates frequencies $f_{res}$, which satisfy the general equation $$f_{res}(l,m,n) = l f_{OR} + m f_{RG2} + n f_{RG1} \qquad (1)$$

(l, m, n are positive or negative whole numbers). The frequency $fs_A$ in this case corresponds to the special case in which l, m, n = +1, that is, $fs_A = f_{OR} + f_{RG2} + f_{RG1}$.

Since frequency $f_{OR}$ is ordinarily of the same order of magnitude as the frequency $fs_A$, whole-number multiples of $f_{OR}$ are ignored in the subsequent considerations; in other words, the coefficient 1 in formula (1) is made equal to +1.

In addition to the desired frequency $fs_A$, interfering frequencies occur in the phase-locked loop PLL, which can be derived from the following formula:

$$f_{res}(m,n) = f_{OR} + m\, f_{RG2} + n\, f_{RG1} \quad (m,n = +1) \tag{2}$$

These interfering frequencies are eliminated, according to the invention, by two procedures:

First, the phase-locked loop is designed as a tracking filter. It thus acts as an adjustable bandpass filter with steep sides and a small bandwidth $B_{TF}$, which is determined by the loop bandwidth of the phase-locked loop PLL. Frequencies $f_{res}$ that lie outside the bandwidth $B_{TF}$ of the tracking filter are consequently blocked. The construction and mode of operation of such a tracking filter are described in greater detail on page 55 of the book cited in the introduction.

The second method for the elimination of interference frequencies comprises selecting the reference frequencies $f_{RG1}$ and $f_{RG2}$ such that all the resulting frequencies $f_{res}$ without $fs_A$ (that is, in formula (2) $f_{res}$ with $m,n = +1$) lie outside the bandwidth $B_{TF}$ of the tracking filter, in accordance with the condition $$|f_{res} - fs_A| > \tfrac{1}{2} B_{RF} \tag{3}$$

In the event that higher attenuation values are required for the interference frequencies, the resulting value for $\tfrac{1}{2} B_{TF}$ can be multiplied by an additional factor ($> 1$); in other words, interfering spurious signals are further outside the bandwidth $B_{TF}$ of the tracking filter and are more strongly attenuated, or suppressed altogether.

Not only are the selected reference frequencies $f_{RG1}$ and $f_{RG2}$ generated by the reference frequency generators RG1 and RG2, but so are their multiples as well. The resulting frequency distribution, with the narrowest interval between lines or spurious signals, as the case may be, is produced by the reference frequency generator RG1 when it generates the lowest frequency $f_{RG1min}$.

The minimum line interval of this frequency distribution, which is fed to the tracking filter, accordingly corresponds to the value of the frequency $f_{RG1min}$. By a proper selection of the other frequencies $f_{RG1}$ and $f_{RG2}$, it is now ensured that additional frequency distributions occurring in the phase-locked loop, which are fed through the offset stage OS and the mixer stage M1 to the tracking filter, have the same coverage as the above-mentioned frequency distribution (provided that no frequency gaps are present in it) and, consequently, also have the same line interval. According to formula (2), there occur in the phaselocked loop PLL frequencies $f_{res} = f_{OR} + m\, f_{RG2} + n\, f_{RG1}$ which form a frequency distribution in the phase-locked loop PLL. Formula (2) also contains all the products that result from the various frequency distributions through mixing. Multiples of the offset reference frequency $f_{OR}$ are disregarded because, together with the frequency distributions they generate, they lie far outside the bandwidth $B_{TF}$ of the tracking filter. The frequency distribution formed by the frequencies $f_{res}$ is fed to the tracking filter, which lets the output frequencies $fs_A = f_{OR} + f_{RG2} + f_{RG1}$ pass through and blocks the spurious signals in accordance with formula (3). The spurious signals, however, are only blocked if they never fall short of the required line interval. Since all the reference frequencies $f_{RG1}$ and $f_{RG2}$ are selected as wholenumber multiples of the frequency $f_{RG1min}$, the frequency distribution of $f_{res}$ has a minimum line interval, which corresponds to the frequency $f_{RG1min}$. The smallest possible line interval of the output frequency $fs_A$ from the next spurious line or spurious signal therefore corresponds to the value of the frequency $f_{RG1min}$. The resulting spurious signals are therefore suppressed by the tracking filter.

The reference frequencies $f_{RG1}$ and $f_{RG2}$ are now selected according to the following criteria:

1) All the reference frequencies $f_{RG1min}$ and $f_{RG2}$ must correspond to a multiple of the frequency $f_{RG1min}$. Preferably, the frequencies $f_{RG2}$ are selected as a multiple of the higher frequency of $f_{RG1}$.

2) The value of the frequency $f_{RG1min}$ must be larger than half the bandwidth of the tracking filter ($f_{RG1min} > \tfrac{1}{2} B_{TF}$). In order to achieve higher attenuation values for the spurious signals, the frequency $f_{RG1min}$ can be increased correspondingly.

Preferably, the frequencies $f_{RG1}$ will be selected according to the following formula (4):

$$f_{RG1} = q \times f_{RG1min} \quad (q = 1,2,3, \ldots, p) \tag{4}$$

The maximum value of the frequency $f_{RG1}$ is accordingly $f_{RG1max} = p \times f_{RG1min}$. Preferably the frequencies $f_{RG2}$ will satisfy the following equation:

$$f_{RG2} = r \times f_{RG1max} \quad (r = 1,2,3, \ldots, s) \tag{5}$$

The maximum value of the frequency $f_{RG2}$ is therefore $f_{RG2max} = s \times f_{RG1max}$. With these conditions for the frequencies $f_{RG1}$ and $f_{RG2}$ respectively, the output signal $s_A$ has the following characteristics:

The intervals between adjacent frequency channels are always the same.

The maximum possible number of channels in this example is $K_{max} = s \times p$.

In a numerical example given below by way of more detailed explanation, the frequencies $f_{RG1}$ and $f_{RG2}$ are selected as follows in accordance with formulas (4) and (5):

| $f_{BZ}$ (MHz) | $x_{(1\ldots5)}$ | $f_{RG1}$ (MHz) | $Y_{(1\ldots4)}$ | $f_{RG2}$ (MHz) |
|---|---|---|---|---|
| 135 | 60 | 2.25 | 12 | 11.25 |
| | 30 | 4.50 | 6 | 22.50 |
| | 20 | 6.75 | 4 | 33.75 |
| | 15 | 9.00 | 3 | 45.00 |
| | 12 | 11.25 | | |

Insertion of the above values in formula (2) produces frequencies that correspond to the frequency $fs_A$, or always deviate from it by multiples of 2.25 MHz. The operation of the tracking filter therefore ensures that only the frequency $fs_A$ arrives at the output of the phase-locked loop PLL.

The number of frequency channels can be increased, since not only the frequency ($f_{OR} + f_{RG2}$), but also the offset reference frequency $f_{OR}$ and the mixing product ($f_{OR} - f_{RG2}$) can be fed to the output of the offset stage OS, for example, by a multiplexer. The resulting maximum number of frequency channels then corresponds to the formula $K_{max} = p \times (2s + 1)$.

The offset reference frequency $f_{OR}$, which must be free from interfering spurious signals, can be produced by multiplication or division from the standard frequency $f_{BZ}$ ($f_{OR} = k \times f_{BZ}$) or through a selection from 1 to n sine wave generators (with the frequencies $fOR_1, \ldots fOR_n$), n can be selected arbitrarily) or it can be generated by a frequency synthesizing device with a variable output frequency. The resulting spurious signals (for example, harmonic oscillations), whose frequencies correspond to a multiple of the offset reference frequency $f_{OR}$, are permissible, since in the phase-locked loop they lie far outside the bandwidth $B_{TF}$ of the tracking filter, and are blocked. If the offset reference frequency $f_{OR}$ is scarned or varied, the number of frequency channels $K_{max}$ can be raised arbitrarily, or an entire band of frequencies can be covered.

For an additional increase of the output frequency $fs_A$ of the frequency synthesizing device in accordance with the invention, the signal $s_A$ can be fed to a frequency multiplication stage which multiplies the frequency $fs_A$ by any desired factor and feeds it to the output of the frequency synthesizing device.

The minimum length of time that the frequency synthesizing device described above requires for a frequency change corresponds roughly to the time it takes the phase-locked loop to reach a steady state at a new frequency. Shorter changing times are possible if the outputs of two or more frequency synthesizing devices in accordance with the invention, which cover identical or different frequency channels are interconnected through a multiplexer. The output of the frequency synthesizing device which generates the instantaneous output frequency $fs_A$ is selected by the multiplexer. In the other frequency synthesizing devices, frequencies that will be needed in the future are set and kept available, so that they can be selected immediately by the multiplexer.

If, from time to time, a more rapid frequency change is desired and the requirements for the quality of the output signals $s_A$ are reduced (increased phase noise), the input of the voltage-controlled oscillator VCO can be driven directly through a digital/analog converter, by way of which the desired frequency $fs_A$ is digitally selected.

Frequencies that do not correspond to the adjustable frequency channels can be generated with reduced quality (spurious signals and increased phase noise) if the signal $s_{M1}$ is fed to a frequency divider which, in standard operation has a division ratio of one and, to generate the desired additional frequencies, has an appropriate division ratio not equal to one.

We claim:

1. A frequency synthesizing device for the generation of signals covering various frequency channels, comprising first and second reference frequency generators (RG1, RG2), an offset stage having a first input coupled to an output of said second reference frequency generator, a second input coupled to a source that provides an offset reference signal ($s_{OR}$) and an output which provides an output signal ($s_{OS}$) and a phase-locked loop (PLL), which operates as a tracking filter having a known bandwidth, having a first input coupled to an output of said first reference frequency generator, a second input coupled to the output of said offset stage and an output which provides an output signal ($s_A$), wherein:

said first and second reference frequency generators output first and second signals ($s_{RG1}$) and ($s_{RG2}$), respectively, whose respective frequencies ($f_{RG1}$) and ($f_{RG2}$) are selectable to be equal to a fraction of a standard frequency ($f_{BZ}$);

the frequency ($f_{OS}$) of the output signal ($s_{OS}$) of said offset stage takes on one of
    (a) the value of a predetermined frequency ($f_{OR}$) of the offset reference signal ($s_{OR}$) and
    (b) the value of a frequency ($f_{OR} + f_{RG2}$) of a sum or difference signal formed by combining the offset reference and second reference frequency generator signals ($s_{OR}$) and ($s_{RG2}$);

at the output of a voltage-controlled oscillator (VCO) in the phase-locked loop (PLL), there is generated the output signal ($s_A$) at a frequency ($fs_A$) formed by the addition of the frequency ($f_{RG1}$) and ($f_{OS}$) of the first reference frequency generator and offset stage signals ($s_{RG1}$) and ($s_{OS}$), respectively;

and wherein all the frequencies output by said first and second reference frequency generators and by said offset stage are selectable and combinable with one another such that the resulting sidebands always lie outside the bandwidth of the phase-locked loop.

2. A frequency synthesizing device according to claim 1, wherein all the frequencies ($f_{RG1}$) and ($f_{RG2}$) provided by the reference frequency generators correspond to a multiple of the lowest frequency ($f_{RG1min}$) generated by the reference frequency generator and that the value of the frequency ($f_{RG1min}$) is larger than half the bandwidth of the tracking filter ($f_{RG1min} > \frac{1}{2} BTF$).

3. A frequency synthesizing device according to claim 2, wherein all the frequencies ($f_{RG2}$) correspond to a multiple of the highest frequency ($f_{RG1max}$) generated by the reference frequency generator (RG1).

4. A frequency synthesizing device according to claim 1, wherein the phase-locked loop includes a phase detector and the signals ($s_A$) and ($s_{OS}$) are fed to a mixer stage (M1) in the phase-locked loop (PLL), at whose output there is formed a signal ($s_{M1}$) with the frequency ($fs_A - f_{OS}$), whose phase is compared in the phase detector with the phase of the signal ($s_{RG1}$).

5. A frequency synthesizing device according to claim 2, wherein the phase-locked loop includes a phase detector and the signals ($s_A$) and ($s_{OS}$) are fed to a mixer stage (M1) in the phase-locked loop (PLL), at whose output there is formed a signal ($s_{M1}$) with the frequency ($fs_A - f_{OS}$), whose phase is compared in the phase detector with the phase of the signal ($s_{RG1}$)

6. A frequency synthesizing device according to claim 3, wherein the phase-locked loop includes a phase detector and the signals ($s_A$) and ($s_{OS}$) are fed to a mixer stage (M1) in the phase-locked loop (PLL), at whose output there is formed a signal ($s_{M1}$) with the frequency ($fs_A - f_{OS}$), whose phase is compared in the phase detector with the phase of the signal ($s_{RG1}$).

7. A frequency synthesizing device according to claim 4, wherein at least one of the following conditions is met:

the offset reference frequency ($f_{OR}$) satisfies the condition $f_{OR} = k \times f_{BZ}$ ($k < 1$ or $k > 1$), k being an integer;

the offset reference frequency ($f_{OR}$) is generated by selection from one of a number of wave generators with a stable frequency; and the offset reference frequency ($f_{OR}$) is at least approximately variable in accordance with half the channel interval of the output frequencies ($fs_A$).

8. A frequency synthesizing device according to claim 1, wherein the signal ($s_A$) can be fed to a frequency multiplier.

9. Frequency synthesizing device according to claim 1, wherein it is interconnected with other similar frequency synthesizing devices such that the signals ($s_A$) of the individual devices are switchable by way of one of a switch and a multiplexer to a user and that the devices in this case cover frequency channels that are identical or, at least in part, different.

10. A frequency synthesizing device according to claim 1, wherein the input of the voltage-controlled oscillator (VCO) can be switched over to the output of a digital/analog converter, by way of the frequency ($fs_A$) can be set by digital means.

11. A frequency synthesizing device according to claim 4, wherein the output signal ($s_{M1}$) of the mixer stage is fed by way of a frequency divider to the input of the phase detector.

12. A frequency synthesizing device for the generation of signals covering various frequency channels, including first and second reference frequency generators, an offset stage providing an output signal ($s_{os}$) and a phase-locked loop being operated as a tracking filter and having a voltage-controlled oscillator and first and second inputs, wherein:

the first and second reference frequency generators (RG1, RG2) generate respective first and second signals ($s_{RG1}$) and ($s_{RG2}$) which are applied to the first input of the phase-locked loop (PLL) and to the offset stage (OS) respectively, and whose respective frequencies ($f_{RG1}, f_{RG2}$) are selectable to be equal to a fraction of a standard frequency ($f_{BZ}$);

the frequency ($f_{OS}$) of the output signal ($s_{OS}$) of the offset stage (OS) is applied to the second input of the phase-locked loop (PLL) and takes on one of (a) the value of a predetermined frequency ($f_{OR}$) of an offset reference signal ($s_{OR}$) and (b) the value of a frequency ($f_{OR} +/- f_{RG2}$) of a sum or difference signal formed by combining signals ($s_{OR}$) and ($s_{RG2}$);

at the output of the voltage-controlled oscillator (VCO) in the phase controlled loop (PLL) there is generated the output signal ($s_A$) of the frequency synthesizing device at a frequency ($fs_A$) formed by the addition of the frequency ($f_{RG1}$) and ($f_{OS}$) of the signals ($s_{RG1}$) and ($s_{OS}$), respectively; and wherein all the frequencies of the reference frequency generators (RG1, RG2) and the offset stage (OS) are selectable and combinable with one another such that the resulting sidebands always lie outside the bandwidth of the tracking filter.

* * * * *